(12) United States Patent
Lee

(10) Patent No.: US 11,873,371 B2
(45) Date of Patent: Jan. 16, 2024

(54) POLYIMIDE FILM FOR DISPLAY SUBSTRATE

(71) Applicant: LG CHEM, LTD., Seoul (KR)

(72) Inventor: Jinho Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 752 days.

(21) Appl. No.: 16/621,641

(22) PCT Filed: Sep. 11, 2018

(86) PCT No.: PCT/KR2018/010603
§ 371 (c)(1),
(2) Date: Dec. 11, 2019

(87) PCT Pub. No.: WO2019/088441
PCT Pub. Date: May 9, 2019

(65) Prior Publication Data
US 2020/0207914 A1 Jul. 2, 2020

(30) Foreign Application Priority Data
Nov. 3, 2017 (KR) .......................... 10-2017-0145815

(51) Int. Cl.
| C08G 73/10 | (2006.01) |
| C08J 5/18 | (2006.01) |
| G01N 5/04 | (2006.01) |
| H10K 77/10 | (2023.01) |

(52) U.S. Cl.
CPC ............ *C08G 73/1067* (2013.01); *C08J 5/18* (2013.01); *G01N 5/04* (2013.01); *C08J 2379/08* (2013.01); *H10K 77/111* (2023.02)

(58) Field of Classification Search
CPC ... C09D 179/00; C08L 79/08; C08G 73/1067; C08G 73/10
See application file for complete search history.

(56) References Cited

U.S. PATENT DOCUMENTS

| 5,115,090 | A | 5/1992 | Sachdev et al. |
| 9,373,735 | B2 | 6/2016 | Shimokawa et al. |
| 9,393,720 | B2 | 7/2016 | Hisano et al. |
| 10,299,378 | B2 | 5/2019 | Park |
| 2012/0028061 | A1 | 2/2012 | Matsumoto et al. |
| 2014/0127497 | A1 | 5/2014 | Nakayama et al. |
| 2014/0134428 | A1 | 5/2014 | Nakayama et al. |
| 2014/0364564 | A1 | 12/2014 | Hong et al. |
| 2015/0210048 | A1* | 7/2015 | Jeong .................. C03C 17/3405 428/212 |
| 2015/0284512 | A1 | 10/2015 | Min et al. |
| 2018/0171077 | A1 | 6/2018 | Oka et al. |
| 2019/0048143 | A1 | 2/2019 | Hong et al. |

FOREIGN PATENT DOCUMENTS

| CN | 102089366 A | 6/2011 |
| CN | 102575034 A | 7/2012 |
| EP | 0455571 A2 | 2/1991 |
| EP | 2287239 A1 | 2/2011 |
| EP | 2722173 A1 | 4/2014 |
| EP | 2722174 A1 | 4/2014 |
| JP | H10-114823 A | 5/1998 |
| JP | 2012-035583 A | 2/2012 |
| JP | 5391905 B2 | 1/2014 |
| JP | 5472387 B2 | 4/2014 |
| JP | 2014-237270 A | 12/2014 |
| JP | 2016-505653 A | 2/2016 |
| KR | 10-2013-0075423 A | 7/2013 |
| KR | 10-2014-0037925 A | 3/2014 |
| KR | 10-2014-0083233 A | 7/2014 |
| KR | 10-2016-0065806 A | 6/2016 |
| KR | 10-2016-0067413 A | 6/2016 |
| KR | 10-1710218 B1 | 2/2017 |
| TW | 201319164 A1 | 5/2013 |
| TW | 201736441 A | 10/2017 |
| WO | 2009-142244 A1 | 11/2009 |

(Continued)

OTHER PUBLICATIONS

Hondred et al Electrothermal Lifetime Prediction of Polyimide Wire Insulation with Application to Aircraft, J.Appl. Polymer Sci, pp. 1639-1644, 2013, Published online May 3, 2013.*

(Continued)

*Primary Examiner* — Gregory Listvoyb
(74) *Attorney, Agent, or Firm* — ROTHWELL, FIGG, ERNST & MANBECK, P.C.

(57) ABSTRACT

The present invention provides a polyimide film comprising a polyimide, of which the $Int_f$ value calculated from equation 1 is −3 or greater when the weight reduction rate measured by the thermogravimetric method (TGA) is 5%. The film according to the present invention can exhibit excellent thermal stability even in high-temperature conditions, and thus maintain excellent heat resistance and mechanical characteristics against high-temperature heat added during the display device manufacturing process.

$$\frac{Ea}{RT} + \ln\left\{\frac{Ea}{\beta R}P(X_f)\right\} = \ln t_f \quad \text{[Equation 1]}$$

In equation 1, Ea, R, T, β, $P(X_f)$, and $t_f$ are the same as those defined in the detailed description.

1 Claim, No Drawings

(56) References Cited

FOREIGN PATENT DOCUMENTS

| WO | 2012-173204 A1 | 12/2012 |
| WO | 2014-104636 A1 | 7/2014 |
| WO | 2016-199926 A1 | 12/2016 |
| WO | 2017-176000 A1 | 10/2017 |

OTHER PUBLICATIONS

Toop, Derek J., "Theory of Life Testing and Use of Thermogravimetric Analysis to Predict the Thermal Life of Wire Enamels," IEEE Transactions on Electrical Insulation, 1971, vol. EI-6, No. 1, p. 2-14.
Extended European Search Report issued for European Patent Application No. 18 873 746.4 dated Jun. 24, 2020, 9 pages.
Jung, et al., "Characterization of Thermal Degradation of Polyamide 66 Composite: Relationship between Lifetime Prediction and Activation Energy", Polymer(Korea), 2012; vol. 36, No. 6, pp. 712-720.
International Search Report issued for International Application No. PCT/KR2018/010603 dated Jan. 2, 2019, 4 pages.

* cited by examiner

POLYIMIDE FILM FOR DISPLAY SUBSTRATE

TECHNICAL FIELD

This application is a 35 U.S.C. § 371 National Phase Entry Application from PCT/KR2018/010603, filed on Sep. 11, 2018, and designating the United States, which claims the benefit of priority to Korean Patent Application No. 10-2017-0145815, filed on Nov. 3, 2017, the entire disclosures of which are incorporated herein by reference.

The present invention relates to a polyimide film for a flexible display device substrate, which has good thermal stability.

BACKGROUND ART

Recent display devices have been focused on weight reduction and miniturization thereof. Glass substrates typically used in the display devices have limits of being heavy and easily cracked and being difficult to be continuously processed. Therefore, many studies have been conducted to replace glass substrates with plastic substrates having advantages of being light, flexible and capable of continuous processing in the field of mobile phones, notebook computers, personal digital assistant (PDA), and the like.

In particular, polyimide (PI) resin has advantages that it is easy to synthesize, and it can be made in the form of a thin film and does not require a crosslinking group for curing. For these reasons, many researchers have tried to s the PI in a flexible plastic display board having light and flexible properties as integrated materials for semiconductors of LCD, PDP and the like, according to the recent trends of electronic products, such as lightweight and refinement.

Generally, the polyimide resin is prepared it the form of a film, particularly by solution polymerization of a dianhydride and a diamine or a diisocyanate to obtain a solution of polyamic acid derivative and coating the solution on silicon wafer or glass, followed by heat curing.

DETAILED DESCRIPTION OF THE INVENTION

Technical Problem

The present invention is designed to solve the technical problem of the related art, and thus, it is an aspect of the present invention to provide a polyimide film which has a high lifetime limit at a high temperature to exhibit improved thermal stability.

It is other aspect of the present invention to provide a flexible display substrate prepared from the polyimide film.

Technical Solution

In order to accomplish the above aspect, the present invention provides a polyimide film comprising a polyimide whose lntf value calculated by Equation 1 is −3 or more when the polyimide exhibits a weight loss of 5% on measurement by thermogravimetric analysis (TGA):

$$\frac{Ea}{RT} + \ln\left\{\frac{Ea}{\beta R}P(X_f)\right\} = \ln t_f \quad \text{[Equation 1]}$$

wherein,
Ea is a thermal decomposition activation energy (KJ/mol) according to the weight loss (%),
R is a gas constant (8.314 J/mol·K),
T is a temperature used (773.15K),
β is a heating rate (600° C./hr),
$P(X_f)$ is a function ($X_f$=Ea/RTd) related to the thermal decomposition activation energy at a thermal decomposition temperature (Td) at which the weight loss of 5% occurs, and
$t_f$ is a lifetime limit (hr).

In one embodiment, the thermal decomposition activation energy (Ea) may be calculated by Equation 2 and the value thereof may be 200 KJ/mol or more at a weight loss of 5%:

$$Ea = -\left\{\frac{R}{b}\frac{d\log\beta_1}{d\left(\frac{1}{T_1}\right)}\right\} \quad \text{[Equation 2]}$$

wherein,
b is a constant (0.457)
R is a gas constant (8.314 J/mol·K)
$T_1$ is a temperature at which a weight loss of 5% occurs, and
$\beta_1$ is a heating rate.

In one embodiment, the polyimide may have a thermal decomposition temperature (Td 5%) of 550° C. or higher at which a weight loss of 5% occurs on measurement by thermogravimetric analysis (TGA).

In one embodiment, the polyimide may be obtained by bringing a polyimide precursor into heat-treatment at a temperature of 450° C. or higher for imidization.

In one embodiment, the polyimide may have a repeat unit of Formula 1:

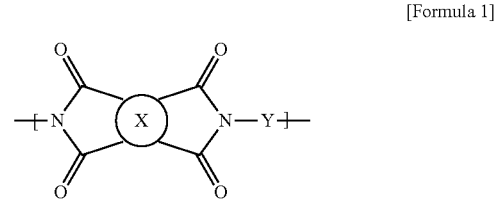

[Formula 1]

In formula 1,
X is a tetravalent organic group comprising an aromatic or alicyclic compound, and
Y is a divalent organic group comprising an aromatic or alicyclic compound.

In one embodiment, X may be a tetravalent organic group selected from the group consisting of Formulas 2a to 2k:

(2a)

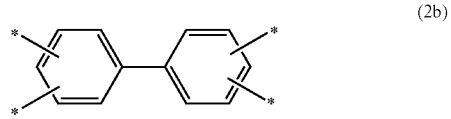

(2b)

-continued (2c) 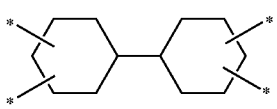

(2d) 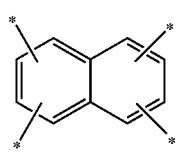

(2e) 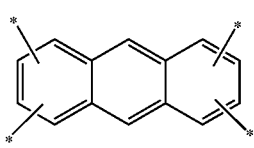

(2f) 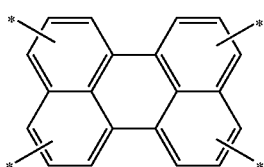

(2g) 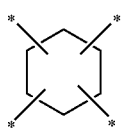

(2h) 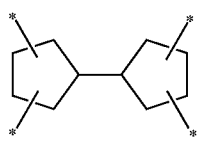

(2i) 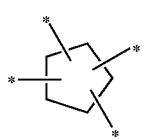

(2j) 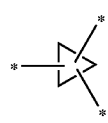

(2k) 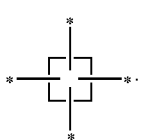

In one embodiment, Y may be a divalent organic group selected from the group consisting of Formulas 3a to 3k:

(3a) 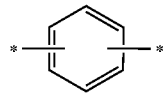

(3b) 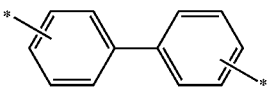

(3c) 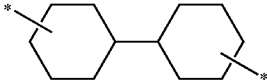

(3d) 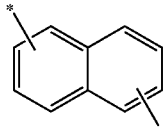

(3e) 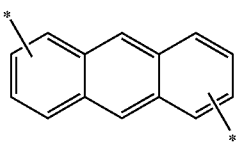

(3f) 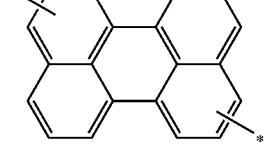

(3g) 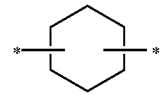

(3h) 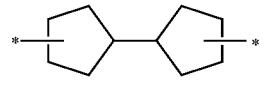

(3i) 

(3j) 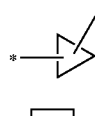

(3k) 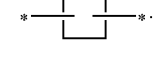

In order to accomplish another aspect, the present invention further provides a display substrate prepared from the polyimide film.

Also, the present invention provides a method of predicting the lifetime limit of a polyimide film using Equation 1:

$$\frac{Ea}{RT} + \ln\left\{\frac{Ea}{\beta R}P(X_f)\right\} = \ln t_f \qquad \text{[Equation 1]}$$

wherein,
Ea is a thermal decomposition activation energy (KJ/mol) according to the weight loss (%),
R is a gas constant (8.314 J/mol·K),
T is a temperature used (773.15K),
β is a heating rate (600° C./hr),
$P(X_f)$ is a function ($X_f$=Ea/RTd) related to the thermal decomposition activation energy at a thermal decomposition temperature (Td) at which the weight loss of 5% occurs, and
$t_f$ is a lifetime limit (hr).

In one embodiment, the thermal decomposition activation energy (Ea) may be calculated by Equation 2:

$$Ea = -\left\{\frac{R}{b}\frac{d\log\beta_1}{d\left(\frac{1}{T_1}\right)}\right\} \qquad \text{[Equation 2]}$$

wherein,
b is a constant (0.457)
R is a gas constant (8.314 J/mol·K)
$T_1$ is a temperature at which a weight loss of 5% occurs, and
$\beta_1$ is a heating rate.

Advantageous Effects

The polyimide film of present invention has a value of $\ln t_f$ calculated by Equation 1 being −3 or more under the conditions that a weight loss measured by thermogravimetric analysis (TGA) is 5% and a used temperature is 773.15 K, thereby exhibiting good thermal stability at a high temperature. Accordingly, the polyimide film can maintain excellent heat resistance and mechanical properties even under high temperature conditions during manufacturing process of a display device.

BEST MODE

Hereinafter, the present invention will be described in detail with reference to a preferable example of the present invention for the purpose of better explanation, not intended to limit the technical scope of the invention. It will be obvious to those skilled in the art that various changes and modifications may be made without departing from the spirit and scope of the invention. In the following description, well-known functions or constructions would not be described in detail if they may obscure the point of the invention.

As used herein, all compounds or organic groups may be substituted or unsubstituted, unless otherwise specified. The term "substituted" means that at least one hydrogen contained in the compound or organic group is substituted with a halogen atom, an alkyl group having 1 to 10 carbon atoms, a halogenated alkyl group, a cycloalkyl group having 3 to 30 carbon atoms, an aryl group having 6 to 30 carbon atoms, a hydroxyl group, an alkoxy group having 1 to 10 carbon atoms, a carboxyl group, an aldehyde group, an epoxy group, a cyano group, a nitro group, an amino group, a sulfonic acid group and a derivative thereof.

Currently, displays have been prepared using plastic substrates to reduce the weight and thickness of glass substrates. Particularly, a display that applies an OLED device on a plastic substrate has advantages of being bent or folded, and is continuously being developed.

In the replacement of a glass substrate with a plastic substrate, it is very important to secure the reliability of panel-driving performances during the manufacturing of a panel and under high temperature environments. The plastic substrates suffer from various thermal stresses during many thermal processes including a high-temperature process of 500° C. or higher in the manufacture of a thin film transistor (TFT) device, and tests for evaluating high-temperature reliability on panel driving. Accordingly, the heat-resistance of plastic substrates is very important in the lifetime thereof.

In order to solve the problem of the related art, the present invention provide a polyimide film comprising a polyimide whose lntf value calculated by Equation 1 is −3 or more when the polyimide exhibits a weight loss of 5% on measurement by thermogravimetric analysis (TGA):

$$\frac{Ea}{RT} + \ln\left\{\frac{Ea}{\beta R}P(X_f)\right\} = \ln t_f \qquad \text{[Equation 1]}$$

wherein,
Ea is a thermal decomposition activation energy (KJ/mol) according to the weight loss (%),
R is a gas constant (8.314 J/mol·K),
T is a temperature used (773.15K),
β is a heating rate (600° C./hr),
$P(X_f)$ is a function ($X_f$=Ea/RTd) related to the thermal decomposition activation energy at a thermal decomposition temperature (Td) at which the weight loss of 5% occurs, and
$t_f$ is a lifetime limit (hr).

With respect to the function of $P(X_f)$ representing $X_f$=Ea/RTd in Equation 1, the relation P may be calculated referring to the document [Derek J. Toop, Theory of Life Testing and Use of Thermogravimetric Analysis to Predict the Thermal Life of Wire Enamels, IEEE TRANSACTIONS ON ELECTRICAL INSULATION, VOL. EI-6, No. 1, March 1971)].

The lifetime limit ($t_f$) refers to a time that a polyimide film can be used at a given temperature without deteriorating the performance thereof. If the lifetime of the polyimide film is less than a predetermined time, it is difficult to conduct high-temperature processes.

The temperature used in Equation 1 refers to a temperature applied when the lifetime limit is measured. In order for the polyimide film to be more suitably used for a display substrate, the used temperature may be 500° C. (773.15 K) or higher. Therefore, it is preferred that the lifetime limit is measured at 773.15 K.

The value of lntf calculated by Equation 1 is −3 or more, and this has the meaning that the lifetime limit ($t_f$) of the polyimide film is 0.05 hrs or longer. When the lifetime limit is shorter than 0.05 hr, it is difficult to escape out-gas from an inorganic film layer being formed on the polyimide film and subject to additional high-temperature processes. As a result, the partial peeling of the film occurs and the uniformity is lowered, making it difficult to conduct the subsequent processes.

In Equation 1, the thermal decomposition activation energy (Ea) is the measured value when a weight loss of the polyimide film measured by thermogravimetric analysis (TGA) is 5%.

The thermal decomposition activation energy (Ea) measured by thermogravimetric analysis (TGA) may be calculated by Equation 2 and the value thereof may be 200 KJ/mol or more, preferably 250 KJ/mol or more at a weight loss of 5%:

$$Ea = -\left\{ \frac{R}{b} \frac{d\log \beta_1}{d\left(\frac{1}{T_1}\right)} \right\}$$ [Equation 2]

wherein,
b is a constant (0.457)
R is a gas constant (8.314 J/mol·K)
$T_1$ is a temperature at which a weight loss of 5% occurs, and
$\beta_1$ is a heating rate.

In one embodiment, the polyimide may have a thermal decomposition temperature (Td 5%) of 550° C. or higher, preferably 580° C. or higher at which a weight loss of 5% occurs on measurement by thermogravimetric analysis (TGA).

In one embodiment, the polyimide may have a repeat unit of Formula 1:

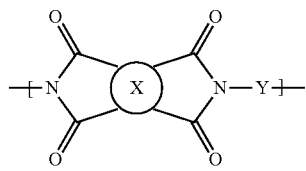

[Formula 1]

In formula 1,
X is a tetravalent organic group comprising an aromatic or alicyclic compound, and
Y is a divalent organic group comprising an aromatic or alicyclic compound.

In the present invention, the X may be a tetravalent organic group comprising a $C_{3-24}$ alicyclic compound or a $C_{6-30}$ aromatic compound. Specifically, the alicyclic compound or the aromatic compound may have rigid skeletons, i.e., a single ring structure or a multi-cyclic structure having one or more rings wherein the rings are bonded via a single bond or are directly bonded with each other. For example, the X may be a tetravalent organic group selected from the group consisting of Formulas 2a to 2k:

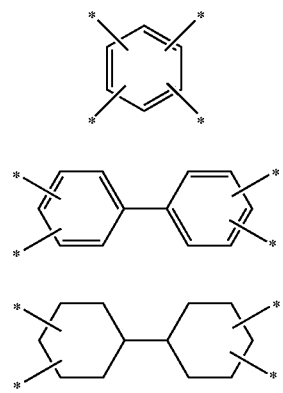

(2a)
(2b)
(2c)

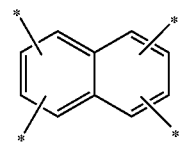

(2d)

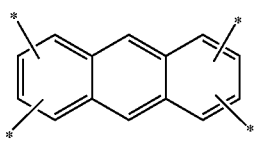

(2e)

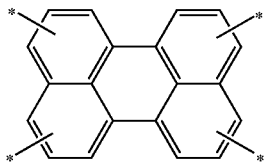

(2f)

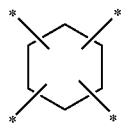

(2g)

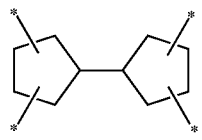

(2h)

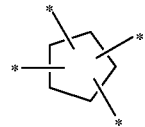

(2i)

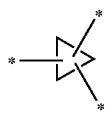

(2j)

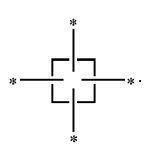

(2k)

At least one hydrogen atom present in each of the tetravalent organic groups of Formulas 2a to 2k may also be substituted with a substituent selected from the group consisting of $C_{1-10}$ alkyl (e.g., a methyl, ethyl, propyl, isopropyl, t-butyl, pentyl or hexyl group), $C_{1-10}$ fluoroalkyl (e.g., a fluoromethyl, perfluoroethyl or trifluoromethyl group), $C_{6-12}$ aryl (e.g., phenyl or naphthyl), sulfonic acid and carboxyl groups.

The Y may be a divalent organic group being $C_{4-30}$ aliphatic or alicyclic compound, a $C_{6-30}$ aromatic compound or a combination thereof. The divalent organic group of aliphatic, alicyclic or aromatic compound may be derived from a diamine comprising a structure selected from divalent organic groups that the aliphatic, alicyclic or aromatic compounds are directly bonded with each other or are bonded via a cross-linker. For example, the Y may be an aromatic compound of $C_{6-30}$ mono-cyclic or multi-cyclic ring, an alicyclic compound of $C_{6-30}$ mono-cyclic or multi-cyclic ring, or a structure that the two or more thereof are bonded via a single bond. Specifically, the alicyclic compound or the aromatic compound may have rigid skeletons, i.e., a single ring structure or a multi-cyclic structure having one or more rings wherein the rings are bonded via a single bond or are directly bonded with each other. For example, the Y may be a divalent organic group selected from the group consisting of Formulas 3a to 3k:

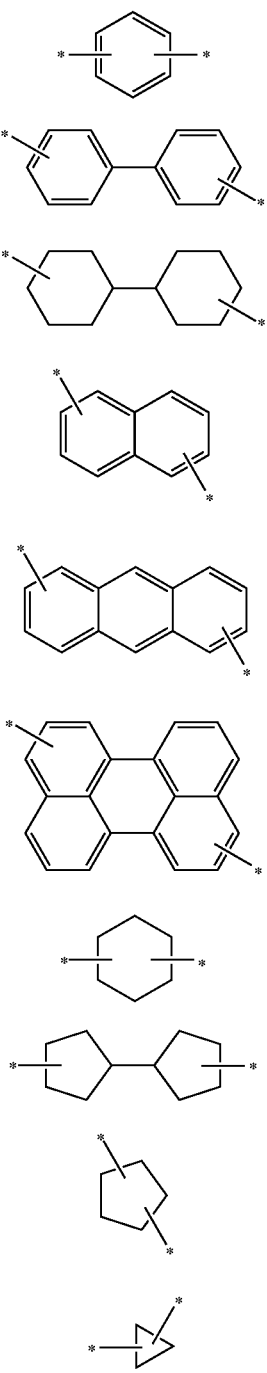

(3k)

At least one hydrogen atom present in each of the divalent organic groups of Formulas 3a to 3k may also be substituted with a substituent selected from the group consisting of $C_{1-10}$ alkyl (e.g., a methyl, ethyl, propyl, isopropyl, t-butyl, pentyl or hexyl group), $C_{1-10}$ fluoroalkyl (e.g., a fluoromethyl, perfluoroethyl or trifluoromethyl group), $C_{6-12}$ aryl (e.g., phenyl or naphthyl), sulfonic acid and carboxyl groups.

As shown in Formulas 2a to 2k or 3a to 3k, when the content of the monomer having an organic group having a rigid structure increases, the polyimide film can have increased heat resistance and raised lifetime limit at a high temperature, thereby exhibiting improved thermal stability.

The polyimide of Formula 1 may be prepared by polymerization of an acid dianhydride and a diamine. The acid dianhydride and the diamine may be used in a molar ratio of 0.95:1 to 1:0.95, preferably 0.98:1 to 1:0.98, or 0.99:1 to 1:0.99.

The polymerization of the dianhydride and the diamine may be carried out by conventional polymerization methods of a polyimide or its precursor, such as solution polymerization.

The reaction of polymerization may be carried out under anhydrous conditions at a temperature of −75 to 50° C., preferably 0 to 40° C. The diamine compound is dissolved in an organic solvent, to which an acid dianhydride is added. The diamine compound and the dianhydride is contained in an amount of about 10 to 30 wt % in the polymerization solvent, and their molecular weight may be controlled according to the polymerization time and reaction temperature.

Also, the solvent which may be used in the polymerization may be selected from the group consisting ketones such as γ-butyrolactone, 1,3-dimethyl-imidazolidinone, methyl ethyl ketone, cyclohexanone, cyclopentanone, and 4-hydroxy-4-methyl-2-pentanone; aromatic hydrocarbons such as toluene, xylene, and tetramethylbenzene; glycol ethers (Cellosolve) such as ethylene glycol monoethylether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether; ethyl acetate, butyl acetate, ethylene glycol monoethyl etheracetate, ethylene glycol monobutyl etheracetate, diethylene glycol monoethyl etheracetate, dipropylene glycol monomethyl etheracetate, ethanol, propanol, ethyleneglycol, propyleneglycol, carbitol, dimethylacetamide (DMAc), N,N-diethylacetamide, dimethylformamide (DMF), diethylformamide (DEF), N-methyl pyrrolidone (NMP), N-ethylpyrrolidone (NEP), N-vinylpyrrolidone, 1,3-dimethyl-2-imidazolydinone, N,N-dimethylmethoxy acetamide, dimethylsulfoxide, pyridine, dimethylsulfone, hexamethyl phosphoamide, tetramethyl urea, N-methyl caprolactam, tetrahyrofuran, m-dioxane, p-dioxane, 1,2-dimethoxyethane, bis(2-methoxyethyl)ether, 1,2-bis(2-methoxyethoxy)ethane, bis[2-(2-methoxyethoxy)] ether, dimethyl propionamide, diethyl propionamide and a mixture thereof.

Preferably, sulfoxide-based solvents such as dimethylsulfoxide, diethylsulfoxide and the like; formamide-based solvents such as N,N-dimethylformamide, N,N-diethylformamide and the like; acetamide-based solvents such as N,N-dimethylacetamide, N,N-diethylacetamide and the like; pyrrolidone-based solvents such as N-methyl-2-pyrrolidone, N-vinyl-2-pyrrolidone and the like may be used alone or in a mixture thereof, but not limited thereto. Also, aromatic hydrocarbons such as xylene, toluene may be further used. Furthermore, in order to facilitate the dissolution of the polymer, an alkali metal salt or alkaline earth metal salt may be further added to the solvent in an amount of about 50 wt % or less based on the total weight of the solvent.

More preferably, the pyrrolidone-based solvents, particularly N-methyl-2-pyrrolidone (NMP) may be used in terms of the improvement of thermal stability and lifetime.

The polyimide precursor obtained by the above method may be coated on one surface of a substrate, followed by imidization, curing and detachment from the substrate, to prepare a polyimide film.

Specifically, the polyimide precursor composition may be in the form of a solution that the polyimide precursor is dissolved in an organic solvent. For example, in the case that the polyimide precursor is synthesized in an organic solvent, the polyimide precursor composition may be the polyimide precursor solution itself obtained after polymerization, may be further added with the same solution, or may be diluted with another solvent after polymerization.

The polyimide precursor composition preferably comprises a solid component in a content to provide a suitable viscosity in consideration of processability such as coating property in a film forming process. The solid content may range from 5 to 20 wt % based on the total weight of the polyimide precursor composition. It is preferred that the polyimide precursor composition has a viscosity of 400 to 50,000 cPs. Also, the viscosity of the polyimide precursor composition may be less than 400 cPs. If the viscosity of the polyimide precursor composition exceeds 50,000 cPs, the flexibility thereof decreases, making it difficult to be uniformly coated on the substrate and causing the process problems in the preparation of a display substrate.

Then, the polyimide precursor composition is coated on one surface of the substrate and subject to heat-treatment, followed by detachment from the substrate to prepare a polyimide film.

The substrate may be glass, a metallic substrate or a plastic substrate, but is not particularly limited thereto. Among these, glass may be preferably used in terms that it has good thermal and chemical stability during the imidization and curing of the polyimide precursor and it can be easily detached from the polyimide film obtained after curing without any damage.

The coating procedure may be carried out by conventional methods, specifically spin coating, bar coating, roll coating, air-knife coating, gravure coating, reverse roll coating, kiss-roll coating, doctor blade coating, spraying coating, dipping coating or brushing. Particularly, casting may be preferable in terms that it allows continuous processes and can increase the imidization rate of the polyimide film.

Also, the polyimide composition may be coated in a thickness so that the final polyimide film can have a thickness suitable for a display substrate.

Specifically, it may be coated in an amount that the final polyimide film can have a thickness of 3 to 30 μm.

After coating the polyimide precursor composition, prior to heat-treatment, a process of drying may be selectively carried out to remove the solvent remained in the polyimide precursor composition.

The process of drying may be carried out by conventional methods, specifically at a temperature of 140° C. or less, or 80° C. to 140° C. The drying temperature of lower than 80° C. may increase the process time, and the drying temperature of higher than 140° C. may induce sudden imidization, making it difficult to obtain the uniform thickness of the polyimide film.

Subsequently, the polyimide film may be subject to heat-treatment for imidization at 450° C. or more. The upper limit of the heat-treatment temperature is not particularly limited, but it may be 500° C.

For example, the heat treatment may be carried out once at a temperature of 450° C. or higher, or may be carried out in multiple stages at least twice. When the heat treatment is carried out in two or ore stages, the final heat treatment temperature may be 450° C. or higher.

Then, the polyimide film formed on the substrate may be detached from the substrate by conventional methods to prepare the polyimide film.

The present invention further provides a display substrate prepared from the polyimide film.

The polyimide of the present invention can provide a polyimide film having a lifetime limit of 0.05 hrs or longer at a temperature of 500° C. or higher, thereby exhibiting good thermal stability under the high temperature conditions and maintaining excellent heat resistance and mechanical properties against a high temperature applied during manufacturing process of a display device.

Accordingly, when the polyimide film of the present invention is used as a display substrate, it can suppress the deterioration of reliability, e.g., the occurrence of bending and the lifting of coating to provide more reliable device. Accordingly, the polyimide can be effectively used in the preparation of a flexible display applied in electronic devices such as an OLED, an LCD, an electronic paper or a solar cell.

Hereinafter, the present invention will be described in more detail with reference to Examples. It will be apparent to those skilled in the art that the following examples are intended to be illustrative of the present invention and not to be construed as limiting the scope of the invention.

EXAMPLE 1

0.055 mol of biphenylcarboxylic dianhydride (BPDA) was dissolved in 100 g of N-methylpyrrolidone (NMP) for 20 minutes under the nitrogen gas. To the resulting solution, 0.055 mol of phenylene diamine (PDA) and 50 g of NMP as an additional solvent were added to bring into reaction for 20 minutes to obtain a polyimide precursor solution.

The polyimide precursor solution obtained above was spin coated onto a glass substrate so that the final film has a thickness of 10 to 20 μm. The polyimide precursor solution-coated glass substrate was put in an oven and subject to heat-treatment at 460° C. to prepare a polyimide film.

COMPARATIVE EXAMPLE 1

The procedures of Example 1 were repeated except that the heat-treatment was carried out at 400° C. to prepare a polyimide film.

COMPARATIVE EXAMPLE 2

0.055 mol of 4,4'-bisphenol A dianhydride (BPADA) was dissolved in 100 g of N-methylpyrrolidone (NMP) for 20 minutes under the nitrogen gas. To the resulting solution, 0.055 mol of 4,4'-methylene bis[cyclohexanamine] (MB-CHA) and 50 g of NMP as an additional solvent were added to bring into reaction for 20 minutes to obtain a polyimide precursor solution.

The polyimide precursor solution obtained above was spin coated onto a glass substrate so that the final film has a thickness of 10 to 20 μm. The polyimide precursor solution-coated glass substrate was put in an oven and subject to heat-treatment at 460° C. to prepare a polyimide film.

EXPERIMENTAL EXAMPLE 1

The polyimide films prepared in Example 1 and Comparative Examples 1 to 2 were measured for their 5% thermal decomposition temperature (Td 5%), thermal decomposition activation energy (Ea) and lifetime limit ($t_f$) at a used temperature. The results thereof were shown in Table 1.

<Thermal Decomposition Temperature (Td 5%)>

The thermal decomposition temperature (Td) at which 5% of weight loss occurs was measured using Discovery TGA (TA Instruments) according to the method of KS M ISO 11358.

<Thermal Decomposition Activation Energy (Ea) and Lifetime Limit ($t_f$)>

The thermal decomposition activation energy (Ea) and the lifetime limit ($t_f$) at a used temperature were measured using Discovery TGA (TA Instruments) according to the method of KS C 2002.

TABLE 1

| Samples | Example 1 | Com. Example 1 | Com. Example 2 | Note |
|---|---|---|---|---|
| Td (° C.) | 600 | 500 | 470 | Temperature that 5% of weight loss occurs |
| Ea (KJ/mol) | 290 | 300 | 240 | |
| $\ln t_f$ | 1.79 | −3.58 | −5.12 | Used condition of 773.15K |
| Lifetime Limit ($t_f$, hr) | 6.00 | 0.03 | 0.01 | |

As shown in Table 1, the polyimide films prepared in Example 1 exhibited high lifetime limit of 6 hrs under the high-temperature condition of 500° C. or higher, and very high thermal decomposition temperature (Td5%).

Thus, the polyimide film of the present invention has high thermal stability and heat resistance at a high temperature, and thus it can be effectively used in a display substrate requiring high-temperature procedures.

While the present invention has been particularly shown and described, it will be understood by those of ordinary skill in the art that the scope of the present invention is not limited thereby and that various changes and modifications may be made therein. Therefore, the actual scope of the present invention will be defined by the appended claims and their equivalents.

What is claimed is:

1. A method of selecting a polyimide film having a life time limit of 0.05 hours or more at a temperature of 500° C. or higher, wherein a lntf value is calculated according to Equation 1 when the polyimide film exhibits a weight loss of 5% measured by a thermogravimetric analysis:

$$\frac{Ea}{RT} + \ln\left\{\frac{Ea}{\beta R}P(X_f)\right\} = \ln t_f \quad \text{[Equation 1]}$$

wherein,

Ea is a thermal decomposition activation energy (KJ/mol) according to the weight loss (%), R is a gas constant of 8.314 J/mol·K, T is a temperature of 773.15K, β is a heating rate of 600° C./hr, P(Xf) is a function (Xf=Ea/RTd) related to the thermal decomposition activation energy at a thermal decomposition temperature (Td) at which the weight loss of 5(%) occurs, and tf is a lifetime limit (hr);

wherein the thermal decomposition activation energy (Ea) is calculated by Equation 2:

$$Ea = -\left\{\frac{R}{b}\frac{d\log\beta_1}{d\left(\frac{1}{T_1}\right)}\right\} \quad \text{[Equation 2]}$$

wherein, b is a constant of 0.457,

R is a gas constant of 8.314 J/mol·K, $T_1$ is a temperature at which a weight loss of 5% occurs, and $\beta_1$ is a heating rate, wherein the polyimide has a repeat unit of Formula 1:

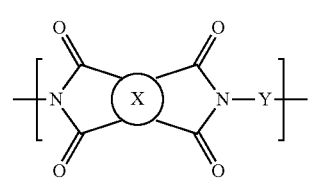

[Formula 1]

wherein X is a tetravalent organic group selected from the group consisting of Formulae 2b to 2k:

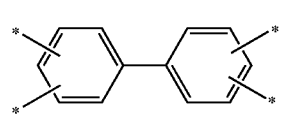

(2b)

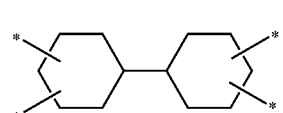

(2c)

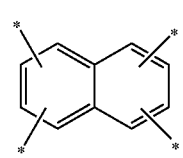

(2d)

-continued
(2e) 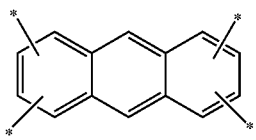
(2f) 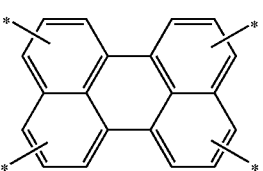
(2g) 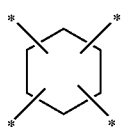
(2h) 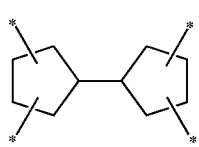
(2i) 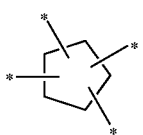
(2j) 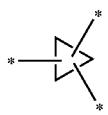
(2k) 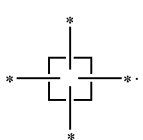
(2k) 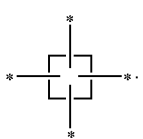
and
wherein Y is a divalent organic group selected from the group consisting of Formulae 3a to 3k:
(3a) 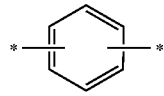
(3b) 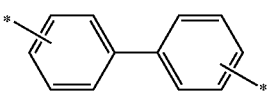
(3c) 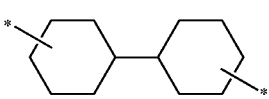
(3d) 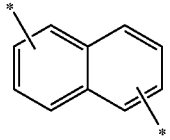
(3e) 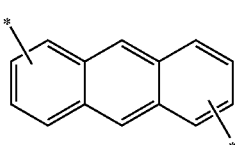
(3f) 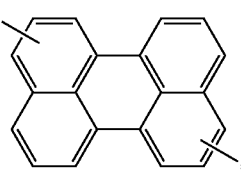
(3g) 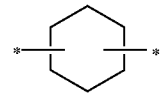
(3h) 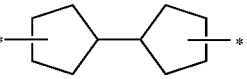
(3i) 
(3j) 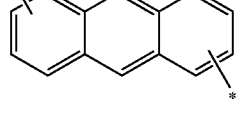
(3k) 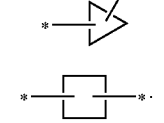
* * * * *